United States Patent
Choi

(10) Patent No.: US 6,631,044 B1
(45) Date of Patent: Oct. 7, 2003

(54) METHOD OF REDUCING A FREQUENCY-RESPONSE PEAKING OF A MAGNETO-RESISTIVE PREAMPLIFIER IN A MASS DATA STORAGE DEVICE, OR THE LIKE

(75) Inventor: Davy H. Choi, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 118 days.

(21) Appl. No.: 09/702,643

(22) Filed: Oct. 31, 2000

(51) Int. Cl.⁷ .............................. G11B 5/02; G11B 5/09
(52) U.S. Cl. ........................... 360/67; 360/46; 360/107
(58) Field of Search ................... 360/67, 46; 330/107

(56) References Cited

U.S. PATENT DOCUMENTS 5,187,448 A * 2/1993 Brooks et al. ............... 330/258
6,208,206 B1 * 3/2001 Leung et al. ................ 330/107

OTHER PUBLICATIONS

Ashar, Magnetic Disk Drive Technology, Heads, Media, Channel, Interfaces, and Integration, IEEE Press, 1997, pp. 101–103, 121–124.

* cited by examiner

Primary Examiner—Regina N. Holder
(74) Attorney, Agent, or Firm—W. Daniel Swayze, Jr.; W. James Brady; Frederick J. Telecky, Jr.

(57) ABSTRACT

A mass data storage device system (70) and method for providing frequency compensation within it are disclosed. The system has a moving media (72) that contains signals encoded in oriented magnetic domains that are detected by a magneto-resistive head (78) positioned in proximity thereto. An amplifier stage (100 or 120) is connected to sense the change in the electrical characteristic of the head, and capacitors (102–105 or 126–131) are operatively connected within the amplifier stage to produce two or three poles in a frequency response of the amplifier stage to reduce a second order frequency response of the head. Preferably, the poles have substantially identical pole locations.

19 Claims, 6 Drawing Sheets

METHOD OF REDUCING A FREQUENCY-RESPONSE PEAKING OF A MAGNETO-RESISTIVE PREAMPLIFIER IN A MASS DATA STORAGE DEVICE, OR THE LIKE

BACKGROUND OF THE INVENTION

1. Field of the Invention

This invention relates to improvements in mass data storage devices, and more particularly to frequency compensated amplifiers and methods for providing frequency compensation to amplifiers thereof to reduce a second order frequency response of a magneto-resistive preamplifier used therein.

2. Relevant Background

Mass data storage devices include tape drives, as well as hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Many applications are still being developed. Applications for hard disk drives are increasing in number, and are expected to further increase in the future.

Recently, hard disk drive manufacturers have begun to use magneto-resistive (MR) heads to provide the required sensitive magnetic transducer for reading data from the spinning disk of the drive. MR heads efficiently convert medium magnetization changes into sufficiently high current or voltage with a minimum amount of noise, detect signals at high densities with a negligible loss in signals, and are cost-effective. Moreover, MR-sensor technology is extendable to very high disk drive densities. The term "magneto-resistive" refers to the change in resistivity of metals in the presence of a magnetic field.

Although in the past, MR heads were thought of as having a very low inductance, recently the inductance of the heads have become a concern as the data densities of the drive have increased. The MR heads, including their inductive components have been modeled in various ways. For example, a circuit model 5 having a differential magneto-resistive head (MR) 10 and its associated preamplifier 12 for use in a hard-disk drive application is shown in FIG. 1. The MR recording head 10 is represented by a resistor 14 designated as $R_{mr}$. In the circuit model of FIG. 1, the MR head is biased by a bias voltage source 16, and the parasitic inductive elements 18 and 20 are shown in series between the resistor 14 and bias voltage source 16. The resistor 14 is capacitively coupled by parasitic capacitors 22 and 24 to the differential preamplifier 26 to provide the differential output voltage $V_{out}$.

A similar circuit model 28 that is biased by a current source 30 is shown in FIG. 2. In the circuit 28, the resistor 14 of the MR head is connected in parallel with the current source 30, and is capacitively coupled by the parasitic capacitances 22 and 24 to the differential amplifier by op-amps 32 and 34. The output of the op-amps 32 and 34 provide the differential input to the differential preamplifier 12. Other combinations of the head bias and sense schemes are known. For example, V-bias/I-sense and I-bias/V-sense schemes can easily be created.

Using the differential V-bias/V-sense amplifier configuration 5 of FIG. 1 for the following illustration, the circuit can be described by the equations $$\frac{\Delta V_S}{\Delta V_B} = \frac{\Delta R_{mr}}{R_{mr}} \qquad \text{EQ(1)}$$

and $$V_{out} = A \times \Delta V_s \qquad \text{EQ(2)}$$

where a change in $R_{mr}$ ($\Delta R_{mr}$) generates a signal voltage of $\Delta V_s$.

However, as mentioned, in reality, the MR head is not a pure resistor. The head contains the parasitic inductances ($L_p$), and the parasitic capacitances ($C_p$) in addition to the intended resistance $R_{mr}$.

The MR heads, themselves, have been modeled in industry. For example, an electrical schematic diagram of a full model 38 of a magneto-resistive head of the type used in mass data storage devices is shown in FIG. 3, and an electrical schematic diagram of a simple model 40 of a magneto-resistive head of the type used in mass data storage devices is shown in FIG. 4. The full model 38 is essentially modeled as a transmission line of inductors 42–45 and capacitors 47–49, with the resistor 14 of the head at one end and the connection to the preamplifier at the other end. The simple model 40 includes only two lumped inductors 50 and 52 and a single lumped capacitor 54.

With reference to the simple model 40 of FIG. 4, it can easily be shown that $$\frac{\Delta V_s'}{\Delta V_s} = \frac{\frac{1}{2 \times L_p \times C_p}}{s^2 + \left(s \times \frac{R_{mr}}{2 \times L_p}\right) + \frac{1}{2 \times L_p \times C_p}} \qquad \text{EQ(3)}$$

where $\Delta V_s$ is the signal voltage generated by $\Delta R_{mr}$, while $\Delta V_s'$ is the resultant signal voltage applied to the preamplifier input.

Note that EQ(3) describes a second-order system with $$\omega_n = \frac{1}{\sqrt{2 \times L_p \times C_p}} \qquad \text{EQ(4)}$$

and $$Q = \frac{1}{R_{mr}} \times \sqrt{\frac{2 \times L_p}{C_p}} \qquad \text{EQ(5)}$$

Therefore, $$V_{out} = A \times \Delta V_S' \qquad \text{EQ(6)}$$

$$= A \times \frac{\frac{1}{2 \times L_p \times C_p}}{s^2 + \left(s \times \frac{R_{mr}}{2 \times L_p}\right) + \frac{1}{2 \times L_p \times C_p}} \times \Delta V_S \qquad \text{EQ(7)}$$

According to EQ(7), the frequency response of $V_{out}/\Delta V_s$ is not only determined by the preamplifier frequency response, but it is exhibiting an additional second-order system response given by the characteristic $\omega_n$ and $Q$ of a second-order system.

The present trend in the industry is to use small values of $R_{mr}$. Unfortunately, as $R_{mr}$ is reduced, the Q given by EQ(5) increases. This effect shows up as an increasing magnitude peaking at about the bandwidth edge of the $V_{out}/\Delta V_s$ frequency response, as can be seen in the gain vs. frequency curve of FIG. 5.

One conventional technique of reducing this peaking is to add a differential capacitor array inside one gain stage 12 of the preamplifier 82, as shown in FIG. 6, to create a pole to suppress the peaking. As shown in FIG. 6, the preamplifier gain-stage 12 is a differential amplifier with emitter degeneration. Capacitors 58 and 60, of value $C_{BWR}$, are connected across the load resistors 62 and 64 to provide poles to compensate the frequency peaks shown in FIG. 5. The pole frequency is given by $$Freq = \frac{1}{2 \times \pi \times R_L \times C_{BWR}} \quad \text{EQ(8)}$$

and can be varied by varying $C_{BBR}$ to tailor to different $R_{mr}$ values. For example, smaller $R_{mr}$ (and thus more peaking) requires a lower frequency pole. This peak-suppression method is commonly known as the "Bandwidth Reduction Technique."

An undesirable side effect of this Bandwidth Reduction Technique is the presence of some frequency-response drooping at some frequencies below the passband edge. Ideally, the passband "ripple" should be minimal and well below ±1 dB. The drooping becomes worse as more $C_{BWR}$ is employed to reduce larger peaking. This phenomenon can be seen in FIG. 5 as $C_{BWR}$ increases, as denoted by arrow 66.

What is needed, therefore, is a compensation technique that can reduce the peaking, with reduced frequency-response drooping at some frequencies below the passband edge.

SUMMARY OF THE INVENTION

In light of the above, therefore, it is an object of the invention to provide a compensation technique that can reduce the frequency response peaking of a magneto-resistive head, with reduced frequency-response drooping at some frequencies below the passband edge.

Thus, according to a broad aspect of the invention, a method is presented for reducing a frequency response peaking of a magneto-resistive head. The method includes providing an amplifier stage to amplify a signal that varies in response to an electrical characteristic of the head, and creating at least two poles in a frequency response of the amplifier to compensate for the frequency response peaking. Preferably, the poles have substantially identical pole locations. In a preferred embodiment, the amplifier stage comprises at least a pair of capacitor compensated differential amplifiers, and in another, the amplifier stage comprises three capacitor compensated differential amplifiers.

In accordance with another broad aspect of the invention, an amplifier is provided for use in amplifying a signal from a magneto-resistive head. The amplifier includes at least two gain stages connected to receive the signal representing changes in the magneto-resistive head. Capacitors are operatively connected within the gain stages to produce at least a pair of poles in a frequency response of the gain stages. Preferably, the poles have substantially identical pole locations. In a preferred embodiment, the capacitors are connected to produce two poles in the frequency response of the gain stages, and in another preferred embodiment, the capacitors are connected to produce three poles in the frequency response of the gain stages.

In yet another broad aspect of the invention, a mass data storage device system is provided which has a moving media that contains signals encoded in oriented magnetic domains. The system has a magneto-resistive head positioned in proximity to the moving media, wherein an electrical characteristic of the head, such as its resistance, is changed in accordance with the oriented magnetic domains. An amplifier stage is connected to sense the change in the electrical characteristic of the head, and capacitors are operatively connected within the amplifier stage to produce at least a pair of poles in a frequency response of the amplifier stage. In a preferred embodiment, the electrical characteristic of the head has a second order frequency response that is reduced by the pair of poles established by the capacitors. The amplifier stage may include, for example, at least two differential amplifiers, a first of the differential amplifiers being connected to sense a voltage across the magneto-resistive head, and the capacitors may include at least a pair of capacitors each associated with a respective one of the differential amplifiers to produce a pair of poles, in one embodiment, and three poles in another embodiment, in the frequency response of the amplifier stage.

BRIEF DESCRIPTION OF THE DRAWINGS

The invention is illustrated in the accompanying drawings, in which.

DETAILED DESCRIPTION OF A PREFERRED EMBODIMENT

Figure 7:
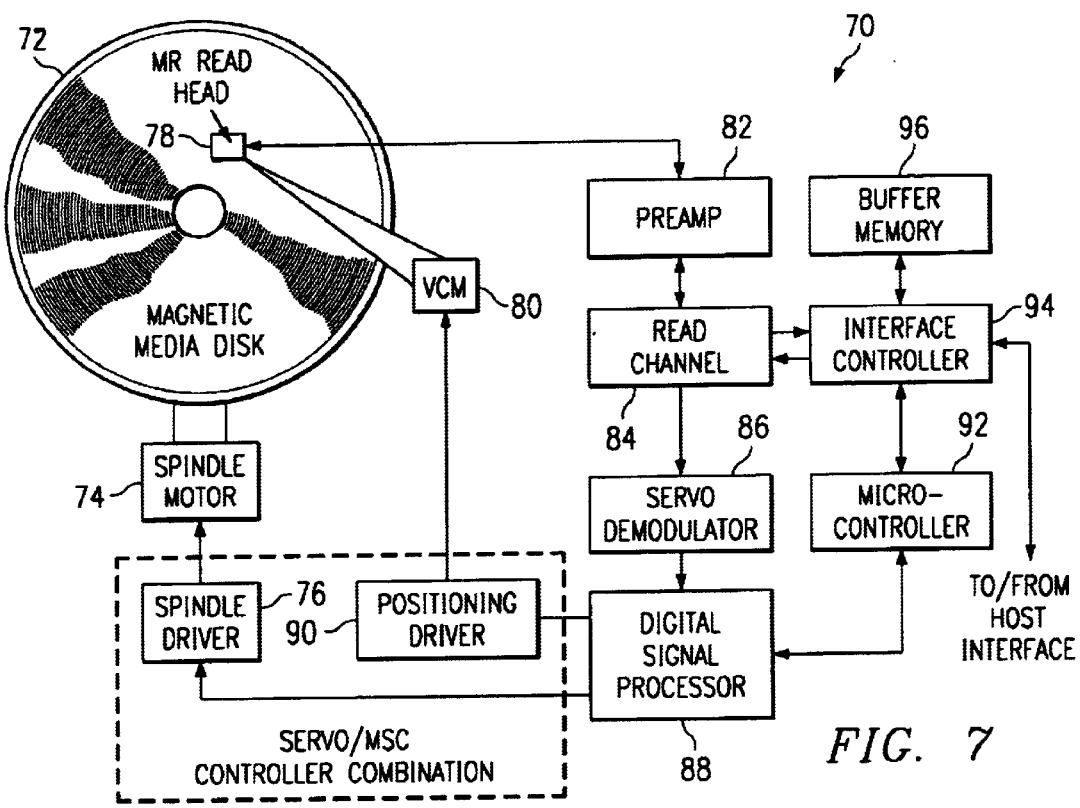
FIG. 7 is a block diagram of a generic disk drive system, illustrating the general environment in which the invention may be practiced.

A block diagram of a generic disk drive system 70, which represents the general environment in which the invention may be practiced is shown in FIG. 7. The system 70 includes a magnetic media disk 72 that is rotated by a spindle motor 74 and spindle driver circuit 76. An MR data transducer or head 78 is locatable along selectable radial tracks (not shown) of the disk 72 by a voice coil motor 80. The radial tracks may contain magnetic states that contain information about the tracks, such as track identification data, location information, synchronization data, as well as user data, and so forth. The head is used to read user data from the disk, as well as to detect signals that identify the tracks and sectors at which data is written, and to detect servo bursts that enable the head to be properly laterally aligned with the tracks of the disk, as is well known.

Analog electrical signals that are generated by the head 78 in response to the magnetic signals recorded on the disk are preamplified by a preamplifier 82, constructed in accordance with the invention, as described below in detail, for delivery to read channel circuitry 84. Servo signals are detected and demodulated by one or more servo demodulator circuits 86 and processed by a digital signal processor (DSP) 88 to control the position of the head via a positioning driver circuit 90.

A microcontroller 92 is typically provided to control the DSP 88, as well as an interface controller 94 to enable data to be passed to and from a host interface (not shown) in known manner. A data memory 96 may be provided, if desired, to buffer data being written to and read from the disk 72.

With reference again to the operation of the MR head 78 and its frequency compensation to reduce the peaking of the gain vs. frequency characteristic, the inadequacy of the conventional method comes from the fact that the peaking is of a second- or higher-order nature while the Bandwidth Reduction Technique described above introduces only a first-order correction to the problem. A much better correction method is to introduce a higher-order pole in the system, and specifically a double-pole or triple-pole. A double pole is a second-order system having two identical pole locations, and a triple-pole is a third-order system with three identical pole locations. In this way, the peaking reduction is maximized while impacting the lower frequency region by the least amount.

Figure 6:
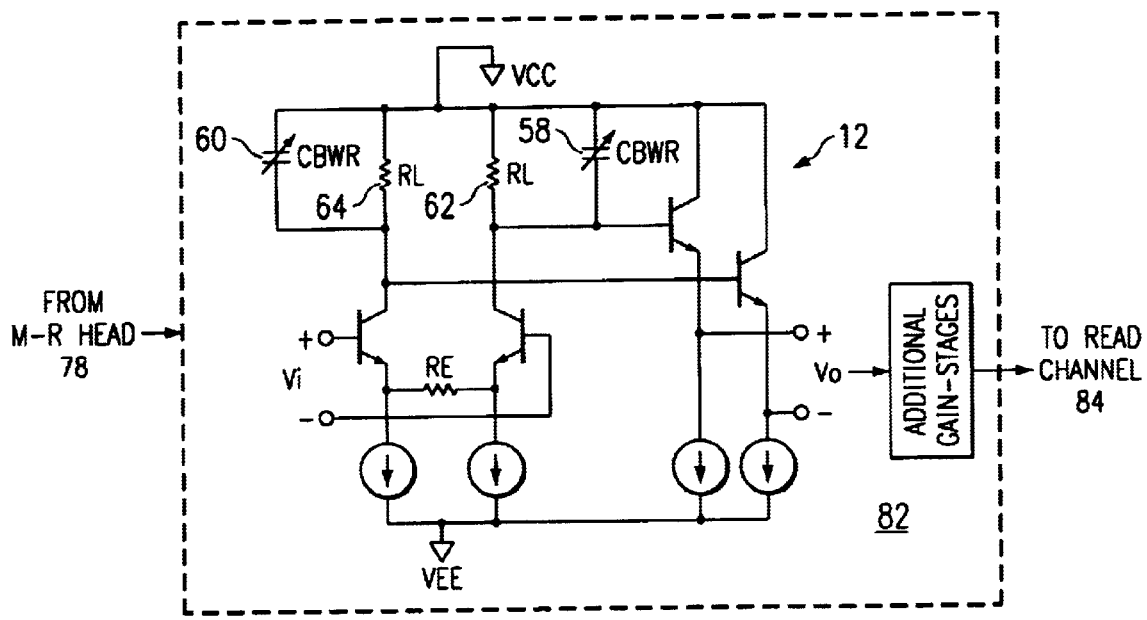
FIG. 6 is an electrical schematic diagram of a preamplifier gain-stage showing a conventional bandwidth reduction technique, according to the prior art.
Figure 8:
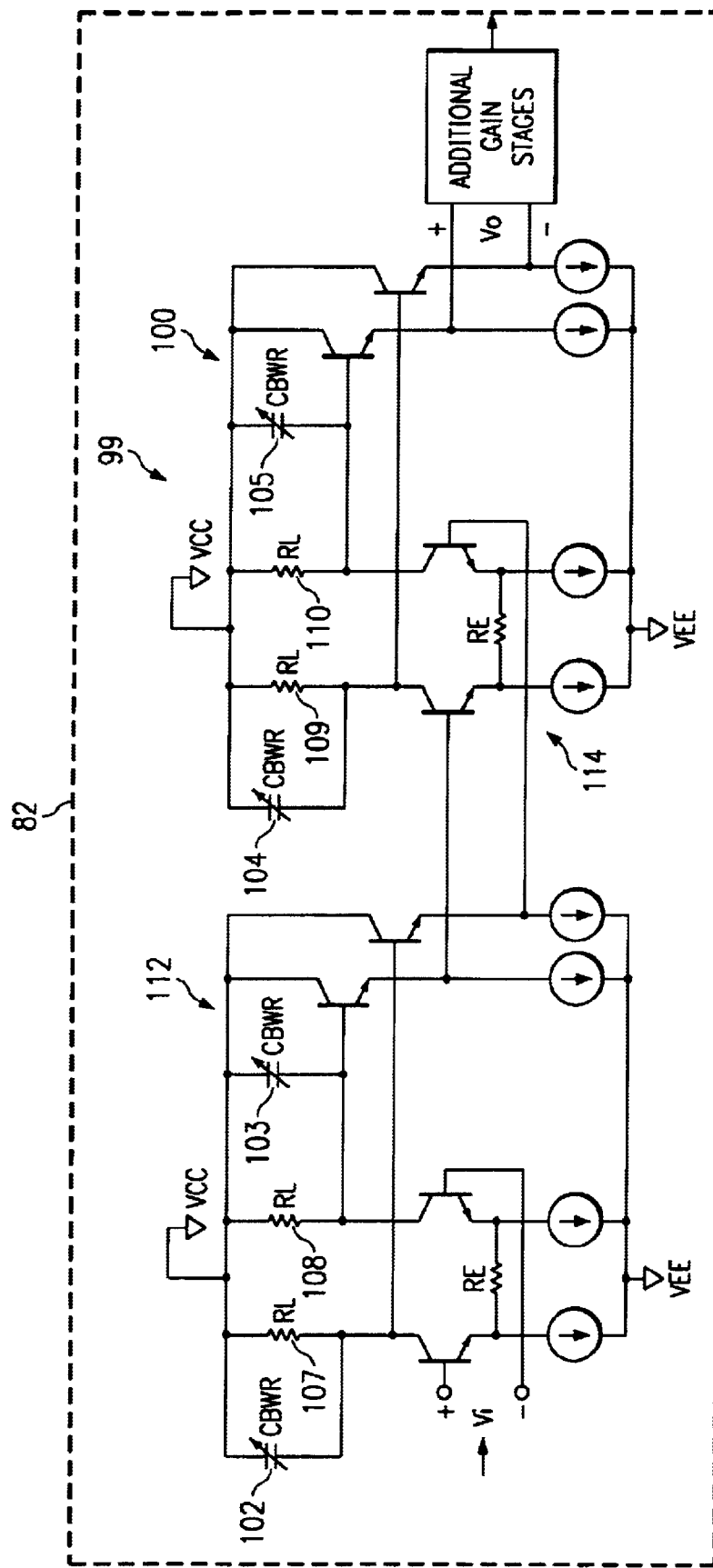
FIG. 8 is an electrical schematic diagram of a preamplifier circuit showing a two-pole bandwidth reduction technique, according to a preferred embodiment of the invention.
Figure 9:
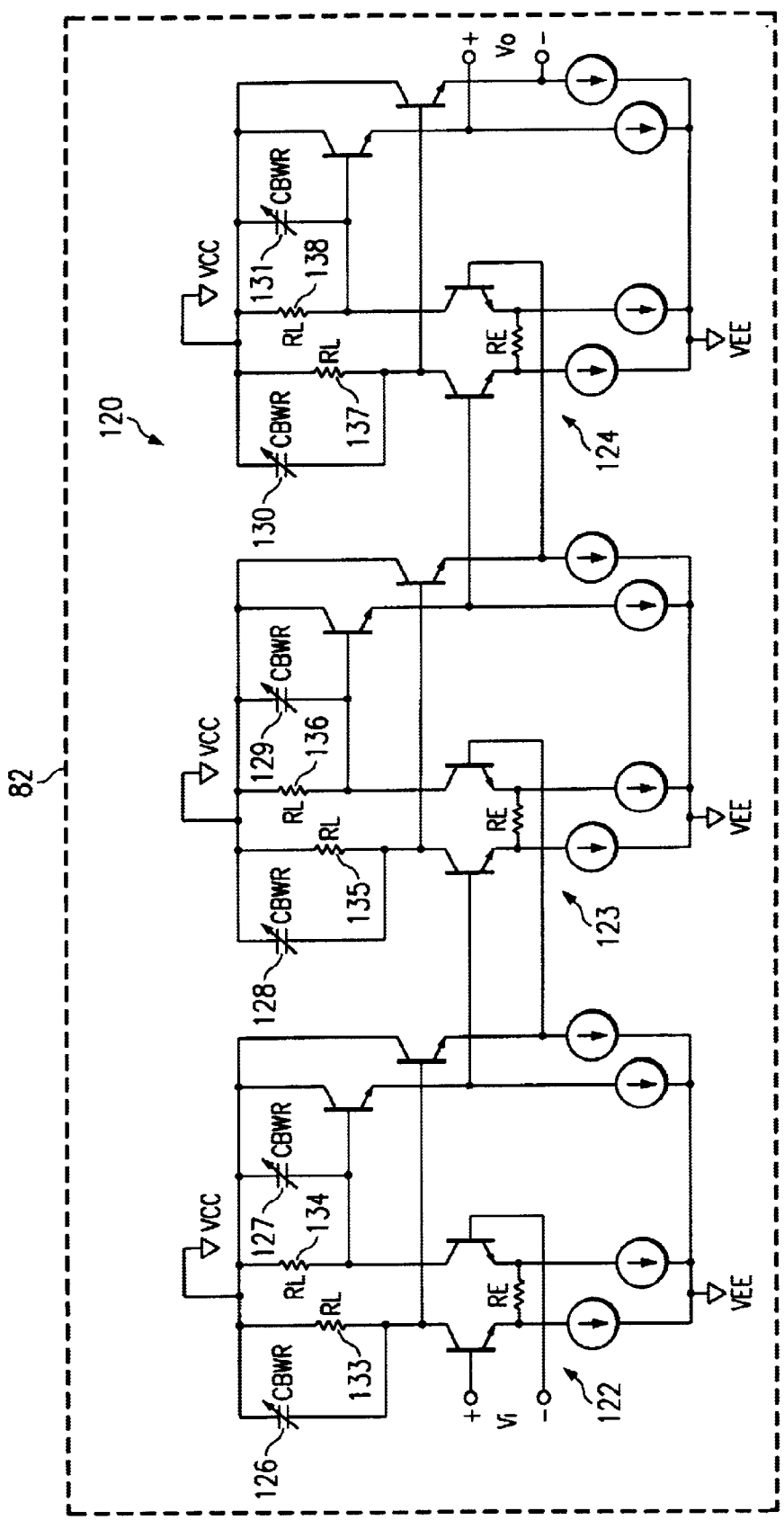
FIG. 9 is an electrical schematic diagram of a preamplifier circuit showing a three-pole bandwidth reduction technique, according to a preferred embodiment of the invention.

The double or triple pole preamplifier can be constructed using two or three amplifier stages of similar construction to the gain stage shown in FIG. 6. Whether there are two or three stages is a trade-off between gain and bandwidth requirements; namely, a two-stage design acquires more bandwidth but less gain. Thus, a convenient and reliable way of building identical poles is to insert additional differential capacitor arrays 100 and 120 as shown in respective FIGS. 8 and 9. With reference now to FIG. 8, gain stage 99 has an array 100, which includes compensating capacitors 102–105 in parallel with load resistors 107–110 of respective differential amplifiers 112 and 114. Similarly, with reference to FIG. 9, the gain stage 120 includes three differential amplifiers 122–124. (There may, of course, be additional gain stages within the preamplifier 82.) The differential amplifiers 122–124 have respective compensating capacitors 126–131 in parallel with respective load resistors 133–138.

In general, for an amplifier with N gain stages having N different sets of load resistors ($R_{L1}$, $R_{L2}$, . . . , $R_{LN}$), the N capacitor arrays should be chosen such that $$R_{L(i)} \times C_{BWR(i)} \times R_{L(i+1)} \times C_{BWR(i+1)} \qquad \text{EQ(9)}$$

for I=1 to N.

Therefore, it is easiest to employ a double-pole if the preamplifier has two gain-stages and a triple-pole if the preamplifier has three gain-stages, etc.

It should be noted that the total $C_{BWR}$ capacitance value for a double-pole (or triple-pole) compensation method is not necessarily larger than that of a single-pole compensation method because the required pole location of the former will be higher than that of the latter to achieve the same amount of peaking reduction. The total amount of $C_{BWR}$ is obviously depends on the values of $R_{L(i)}$ for different i.

More particularly, EQ(9) should take into account the parasitic capacitances, $C_{np}$, already existing at the input-transistor collector nodes of all individual gain stages. Thus, a more accurate formulation of EQ(9) is $$R_{L(i)} \times \lfloor C_{BWR(i)} + C_{np(i)} \rfloor = R_{L(i+1)} \times \lfloor C_{BWR(i+1)} + C_{np(i+1)} \rfloor$$

Figure 1:
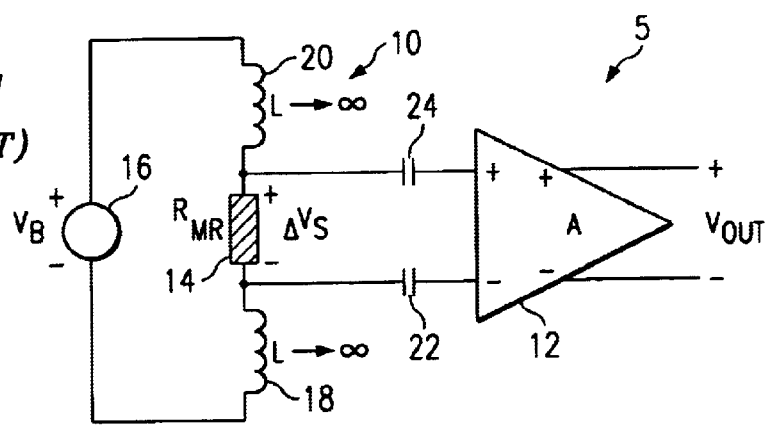
FIG. 1 is an electrical schematic diagram of a differential preamplifier and its operative connection to a magneto-resistive head, illustrating a V-bias/V-sense scheme, according to the prior art.
Figure 2:
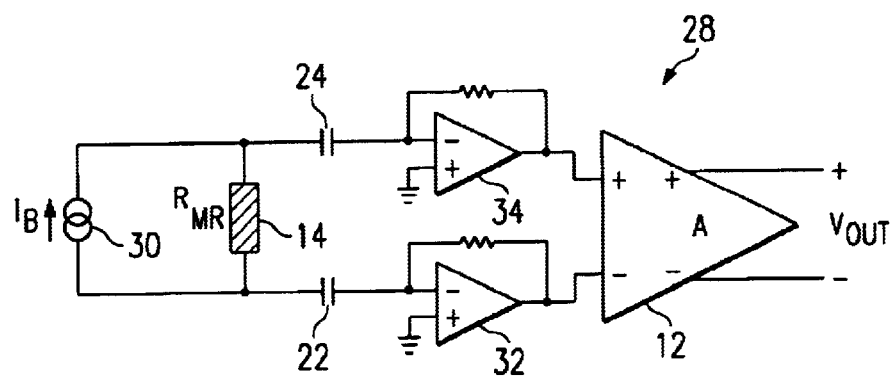
FIG. 2 is an electrical schematic diagram of a differential preamplifier and its operative connection to a magneto-resistive head, illustrating an I-bias/I-sense scheme, according to the prior art.
Figure 3:
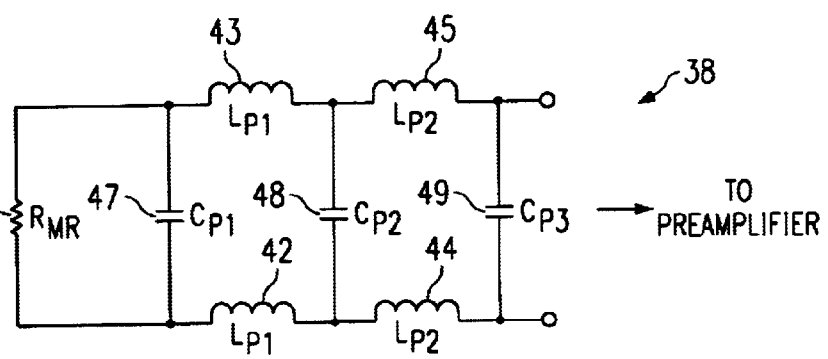
FIG. 3 is an electrical schematic diagram of a full model of a magneto-resistive head of the type used in mass data storage devices, according to the prior art.
Figure 4:
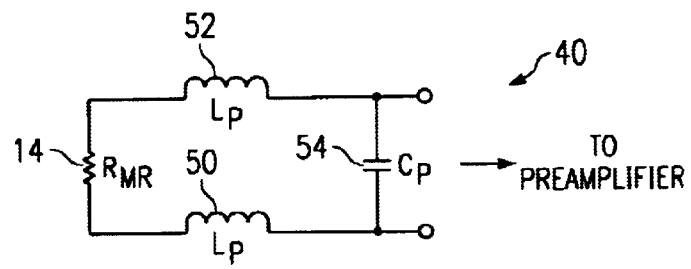
FIG. 4 is an electrical schematic diagram of a simple model of a magneto-resistive head of the type used in mass data storage devices, according to the prior art.
Figure 5:
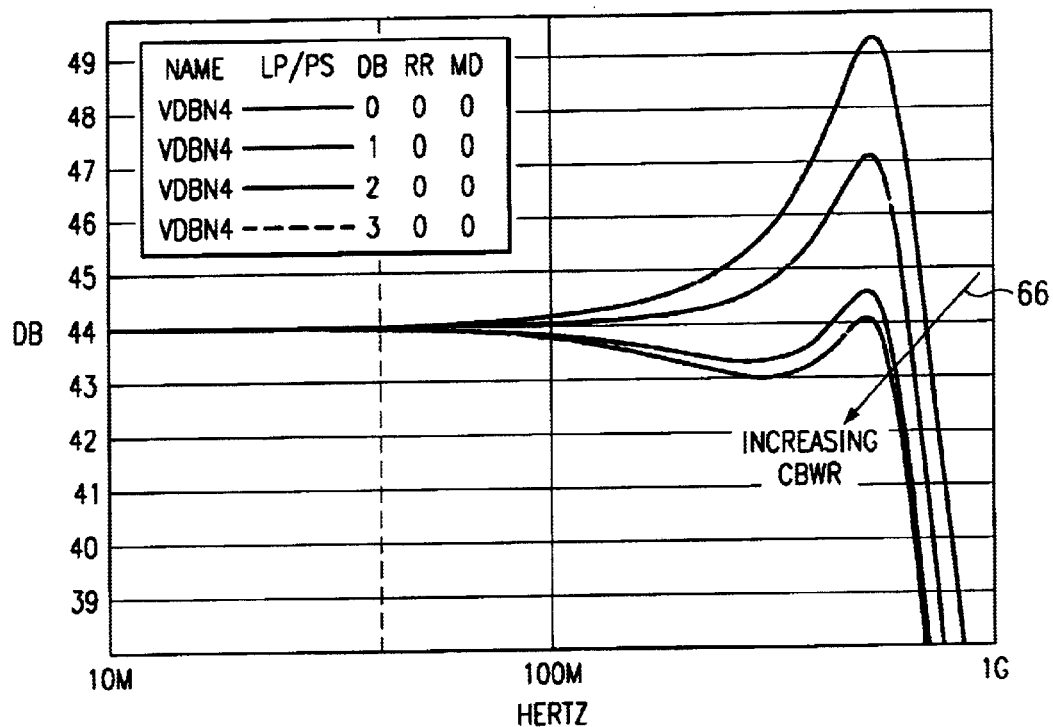
FIG. 5 is a graph of gain vs. frequency, illustrating the preamplifier gain peaking of the preamplifier gain-stage of FIG. 6.
Figure 10:
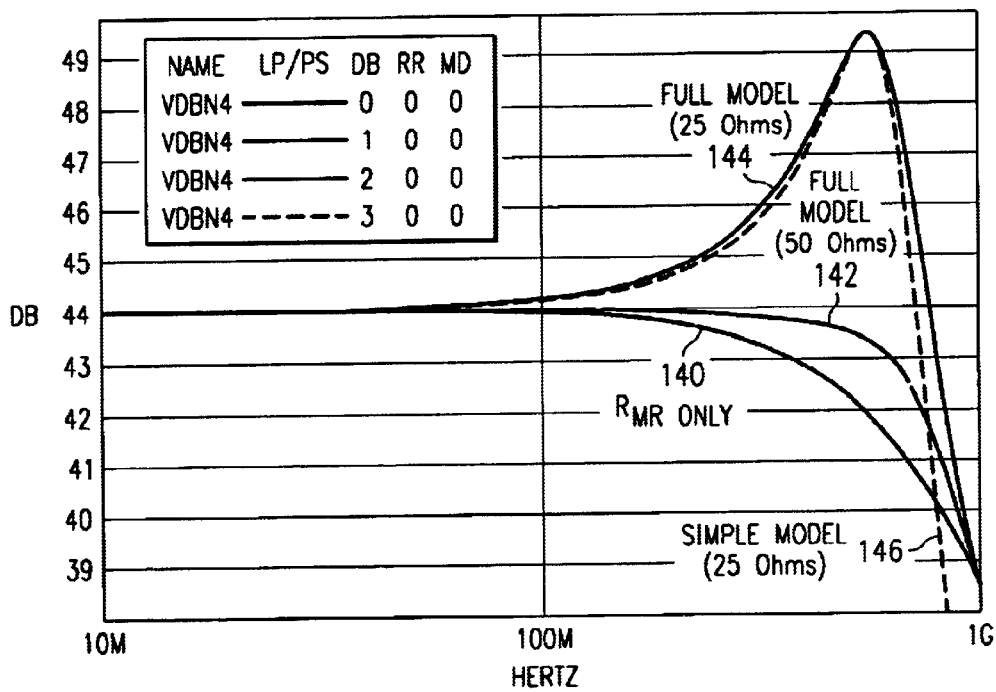
FIG. 10 is a graph of gain vs. frequency, illustrating the preamplifier gain peaking compensation of the preamplifier gain-stage of FIG. 6.

FIG. 10 shows five different preamplifier frequency-response characteristics without the use of any $C_{BWR}$. For all cases, the preamplifier is assumed to have two gain stages: The first stage has $G_{m1}$=40 mA/V, $R_{L1}$=2 kohms and $C_{npi}$=0.1 pF. The second stage has $G_{m2}$=2 mA/V, $R_{L2}$=1 kohms and $C_{np2}$=0.1 pF. The curve 140 represents $R_{MR}$ only in which only a resistor (50 or 25 ohms) is used to represent the head. The curve 142 is of the full model circuit of FIG. 3, and assumes that $L_{p1}$=$L_{p2}$=12 nH, $C_{p1}$=$C_{p3}$=2 pF, $C_{p2}$=4 pF, and the resistor is 50 ohms. The curve 144 is also of the full model circuit of FIG. 3, and assumes that $L_{p1}$=$L_{p2}$=12 nH, $C_{p1}$=$C_{p3}$=2 pF, $C_{p2}$=4 pF, and the resistor is 25 ohms. Finally, the curve 146 is of the simple model of FIG. 4, with $L_p$=15.8 nH and $C_p$=4.7 pF. These values are chosen such that, for $R_{mr}$=25 ohms, its peaking characteristic is similar to that of the full model case.

Figure 11:
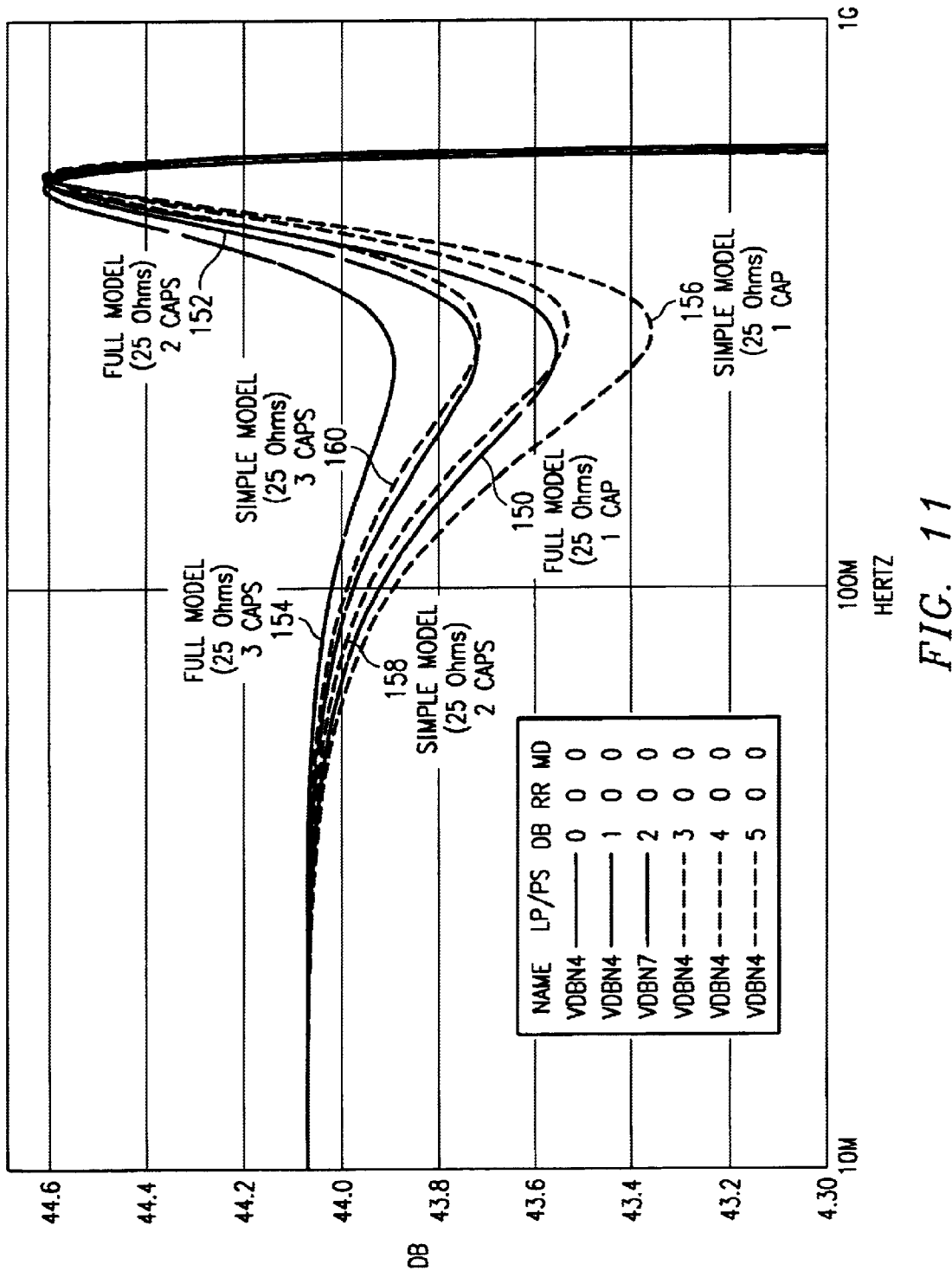
FIG. 11 is a graph of gain vs. frequency, illustrating the preamplifier gain peaking compensation of the preamplifier circuit of various preamplifier models, according to a preferred embodiment of the invention.

FIG. 11 shows the resultant frequency responses for $R_{mr}$=25 ohms with appropriate $C_{BWR}$ values applied such that the high-frequency gain peaking is about 0.5 dB. In the full model curve 150 "1 Cap" refers to the conventional method with $C_{BWR2}$=0.36 pF. In the full model curve 152, "2 Caps" refers to the double-pole scheme of the invention with $C_{BWR1}$=0.065 pF and $C_{BWR2}$=0.23 pF. In the full model curve 154, "3 Caps" refers to the triple-pole scheme of the invention with $C_{BWR1}$=0.026 pF and $C_{BWR2}$=$C_{BWR3}$=0.152 pF. To set up the third gain stage, a unity-gain stage may be used with $G_{m3}$=1 mA/V, $R_{L3}$=1 kohms and $C_{np3}$=0.1 pF.

Also shown in FIG. 11 are the simple model curves 156, 158 and 160. The simple model curves are substantially the same as the above, but use the simple head model. The same $C_{BWR}$ values are used as above.

Thus, it is clear that "3 Caps" is the best as far as minimizing frequency-response drooping is concerned. The "2 Caps" method follows as the second best one versus the conventional "1 Cap" method.

It should be noted that although the invention has been described and illustrated in conjunction with a differential amplifier embodiment of the preamplifier circuit, the principles of the invention can be equally advantageously applied to single-ended amplifier embodiments.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for reducing a frequency response peaking of a magneto-resistive preamplifier, comprising: providing an amplifier stage to amplify a signal that varies in response to an electrical characteristic of a magneto-resistive head;

and creating at least two poles in a frequency response of said amplifier stage to compensate for said frequency response peaking.

2. The method of claim 1 wherein said at least two poles have substantially identical pole locations.

3. The method of claim 1 wherein said signal is a voltage, and wherein said amplifier stage comprises at least a pair of capacitor compensated differential amplifiers.

4. The method of claim 1 wherein said signal is a voltage, and wherein said amplifier stage comprises three capacitor compensated differential amplifiers.

5. The method of claim 1 wherein said creating at least two poles in the frequency response of said amplifier stage comprises adding capacitive elements in said amplifier stage.

6. The method of claim 5 wherein said adding a capacitive element comprises adding a capacitive element in the amplifier stage to create two poles in the frequency response of the amplifier stage.

7. The method of claim 5 wherein said adding a capacitive element comprises adding a capacitive element in the amplifier stage to create three poles in the frequency response of the amplifier stage.

8. An amplifier for use in amplifying a signal from a magneto-resistive head, comprising:

at least two gain stages connected to receive said signal representing changes in said magneto-resistive head;

capacitors operatively connected within said gain stages to produce at least a pair of poles in a frequency response of said gain stages.

9. The amplifier of claim 8 wherein said at least two poles have substantially identical pole locations.

10. The amplifier of claim 8 wherein said capacitors are operatively connected within said gain stages to produce two poles in a frequency response of said gain stages.

11. The amplifier of claim 8 wherein said capacitors are operatively connected within said gain stages to produce three poles in a frequency response of said gain stages.

12. The amplifier of claim 8 wherein said gain stages are differential amplifiers, at least one of which being connected to receive said signal representing changes in said magneto-resistive head as a differential input.

13. A mass data storage device system having a moving media containing signals encoded in oriented magnetic domains, comprising:

a magneto-resistive head positioned in proximity to said moving media wherein an electrical characteristic of said head is changed in accordance with said oriented magnetic domains;

an amplifier stage connected to sense said change in said electrical characteristic of said head;

and capacitors operatively connected within said amplifier stage to produce at least a pair of poles in a frequency response of said amplifier stage.

14. The device of claim 13 wherein said capacitors produce said poles at substantially identical pole locations.

15. The device of claim 13 wherein said electrical characteristic has a second order frequency response that is reduced by said pair of poles established by said capacitors.

16. The device of claim 13 wherein said amplifier stage comprises at least two differential amplifiers, a first of said differential amplifiers being connected to sense a voltage across said magneto-resistive head;

and wherein said capacitors comprise at least a pair of capacitors each associated with a respective one of said differential amplifiers to produce a pair of poles in said frequency response of said amplifier stage.

17. The device of claim 16 wherein said at least a pair of capacitors comprises two pair of capacitors, each pair being contained within a respective one of said differential amplifiers.

18. The device of claim 13 wherein said amplifier stage comprises three differential amplifiers, at least a first of said differential amplifiers being connected to sense a voltage across said magneto-resistive head;

and wherein said capacitors comprise at least three capacitors each associated with a respective one of said differential amplifiers to produce three poles in said frequency response of said amplifier stage.

19. The device of claim 18 wherein said at least three capacitors comprise three pair of capacitors, each pair contained within a respective one of said differential amplifiers.

* * * * *